(12) United States Patent
Li et al.

(10) Patent No.: US 11,664,783 B2
(45) Date of Patent: May 30, 2023

(54) RESONATOR AND SEMICONDUCTOR DEVICE

(71) Applicant: THE 13TH RESEARCH INSTITUTE OF CHINA ELECTRONICS TECHNOLOGY GROUP CORPORATION, Hebei (CN)

(72) Inventors: Liang Li, Shijiazhuang (CN); Xin Lv, Shijiazhuang (CN); Dongsheng Liang, Shijiazhuang (CN)

(73) Assignee: THE 13TH RESEARCH INSTITUTE OF CHINA ELECTRONICS, Hebei (CN)

( * ) Notice: Subject to any disclaimer, the term of this patent is extended or adjusted under 35 U.S.C. 154(b) by 418 days.

(21) Appl. No.: 16/970,006

(22) PCT Filed: Feb. 13, 2019

(86) PCT No.: PCT/CN2019/074933
§ 371 (c)(1),
(2) Date: Aug. 14, 2020

(87) PCT Pub. No.: WO2020/155192
PCT Pub. Date: Aug. 6, 2020

(65) Prior Publication Data
US 2021/0105001 A1    Apr. 8, 2021

(30) Foreign Application Priority Data
Jan. 28, 2019  (CN) .......................... 201910080476.3

(51) Int. Cl.
*H03H 9/17* (2006.01)
*H03H 3/02* (2006.01)
(52) U.S. Cl.
CPC .............. *H03H 9/173* (2013.01); *H03H 3/02* (2013.01); *H03H 2003/021* (2013.01)

(58) Field of Classification Search
CPC ..................................................... H03H 9/173
See application file for complete search history.

(56) References Cited

U.S. PATENT DOCUMENTS

| 9,520,855 B2 | 12/2016 | Feng et al. |
| 2014/0111288 A1* | 4/2014 | Nikkel ............... H03H 9/02157 333/187 |

(Continued)

FOREIGN PATENT DOCUMENTS

| CN | 101465628 A | 6/2009 |
| CN | 104868871 A | 8/2015 |

(Continued)

OTHER PUBLICATIONS

English Translation of CN 201465628, Bo (Year: 2009).*
International Search Report in the international application No. PCT/CN2019/074933, dated Oct. 29, 2019, 2 pgs.

*Primary Examiner* — Bryan P Gordon
(74) *Attorney, Agent, or Firm* — Cooper Legal Group, LLC

(57) ABSTRACT

The application discloses a resonator and a semiconductor device. The resonator includes: a substrate; and a multilayer structure formed on the substrate. The multilayer structure successively includes a lower electrode layer, a piezoelectric layer and an upper electrode layer from bottom to top. A cavity is formed between the substrate and the multilayer structure. The cavity is delimited by an upper surface of the substrate and a lower surface of the multilayer structure. A middle region of a part, corresponding to the cavity, of the lower surface of the multilayer structure is a plane. A smooth curved surface for smooth transition is between an edge of the middle region and an edge of the cavity, and the smooth curved surface is between the upper surface of the substrate and the plane.

12 Claims, 9 Drawing Sheets

(56) References Cited

U.S. PATENT DOCUMENTS

| | | | |
|---|---|---|---|
| 2015/0244346 A1* | 8/2015 | Feng | H03H 9/02031 333/187 |
| 2016/0035960 A1* | 2/2016 | Lee | H03H 9/173 216/13 |
| 2018/0083597 A1* | 3/2018 | Han | H03H 9/02118 |

FOREIGN PATENT DOCUMENTS

| | | |
|---|---|---|
| CN | 208079029 U | 11/2018 |
| CN | 209088901 U | 7/2019 |
| JP | 2008205872 A | 9/2008 |

\* cited by examiner

RESONATOR AND SEMICONDUCTOR DEVICE

CROSS-REFERENCE TO RELATED APPLICATIONS

The present application is a national stage of International Application No. PCT/CN2019/074933, filed on Feb. 13, 2019, which claims priority to Chinese Patent Application No. 201910080476.3, filed on Jan. 28, 2019. The disclosures of International Application No. PCT/CN2019/074933 and Chinese Patent Application No. 201910080476.3 are hereby incorporated by reference in their entireties.

TECHNICAL FIELD

The application relates to the technical field of semiconductors, and particularly to a resonator and a semiconductor device.

BACKGROUND

A resonator may be used to realize signal processing functions in various electronic applications. For example, in some cellular phones and other communication devices, the resonator is used as a filter for signals transmitted and/or received. Depending on different applications, several different types of resonators may be used, for example, a Film Bulk Acoustic Resonator (FBAR), a coupled resonator filter (SBAR), a Stacked Bulk Acoustic Resonator (SBAR), a Dual Bulk Acoustic Resonator (DBAR) and a Solidly Mounted Resonator (SMR).

A typical acoustic resonator includes an upper electrode, a lower electrode, a piezoelectric material between the upper and lower electrodes, an acoustic reflection structure under the lower electrode and a substrate under the acoustic reflection structure. In general, an overlapping region of three material layers, i.e., the upper electrode, a piezoelectric layer and the lower electrode, in a thickness direction is defined as an effective region of the resonator. When a voltage signal of a certain frequency is applied between the electrodes, an acoustic wave that is vertically propagated may be generated between the upper and lower electrodes in the effective region, due to an inverse piezoelectric effect of the piezoelectric material. The acoustic wave is reflected to and fro between an interface of the upper electrode and the air and the acoustic reflection structure under the lower electrode and resonates at a certain frequency.

SUMMARY

Technical Problem

In view of the foregoing problem, embodiments of the application provide a resonator with a novel structure and a semiconductor device.

Technical Solution

A first aspect of the embodiments of the application provides a resonator. The resonator may include a substrate and a multilayer structure formed on the substrate. The multilayer structure successively includes a lower electrode layer, a piezoelectric layer and an upper electrode layer from bottom to top.

A cavity may be formed between the substrate and the multilayer structure. The cavity may be delimited by an upper surface of the substrate and a lower surface of the multilayer structure. A middle region of a part, corresponding to the cavity, of the lower surface of the multilayer structure may be a plane. A smooth curved surface for smooth transition may be between an edge of the middle region and an edge of the cavity, and the smooth curved surface may be between the upper surface of the substrate and the plane.

Optionally, the smooth curved surface may include a first curved surface and second curved surface that are connected in a manner of smooth transition.

Optionally, a vertical section of the first curved surface may have a shape of inverted parabola, a vertical section of the second curved surface may have a shape of parabola, and the first curved surface may be below the second curved surface.

Optionally, a curvature of the smooth curved surface at each point may be less than a first preset value.

Optionally, an included angle between the substrate and a tangent plane at a junction of the smooth curved surface and the substrate may be less than 45 degrees.

Optionally, a part, corresponding to the cavity, of the upper surface of the substrate has no sudden changes.

Optionally, a height of the cavity may be any value between 100 nm and 2,000 nm.

Optionally, the substrate may be any one of a gallium arsenide substrate, a silicon carbide substrate, a sapphire substrate, a lithium niobate substrate, a lithium tantalate substrate or various composite substrates.

Optionally, the substrate may be a Si substrate.

A second aspect of the embodiments of the application provides a semiconductor device including any abovementioned resonator.

Beneficial Effects

According to the embodiments of the application, the cavity is formed between the substrate and the multilayer structure, the cavity is delimited by the upper surface of the substrate and the lower surface of the multilayer structure, the middle region of the part, corresponding to the cavity, of the lower surface of the multilayer structure is a plane, the smooth curved surface for smooth transition is between the edge of the middle region and the edge of the cavity, and the smooth curved surface is between the upper surface of the substrate and the plane, so that a novel resonator structure with higher performances is formed.

Moreover, owing to the cavity structure in the application, a process for manufacturing the resonator is made simple and easy, so that the production yield and reproducibility are higher.

BRIEF DESCRIPTION OF THE DRAWINGS

In order to describe the technical solutions in the embodiments of the application more clearly, the drawings required to be used when describing the embodiments or a conventional art will be simply introduced below. It is apparent that the drawings described below are only some embodiments of the application. Other drawings may further be obtained by those of ordinary skill in the art based on these drawings without creative work.

DETAILED DESCRIPTION

For making the technical problem to be solved, technical solutions and beneficial effects of the application clearer, the application will further be described below with reference to the drawings and the embodiments in detail. It is to be understood that specific embodiments described here are only used to illustrate the application and not intended to limit the application.

The application will further be described below with reference to the drawings and specific implementation modes in detail.

Figure 1:
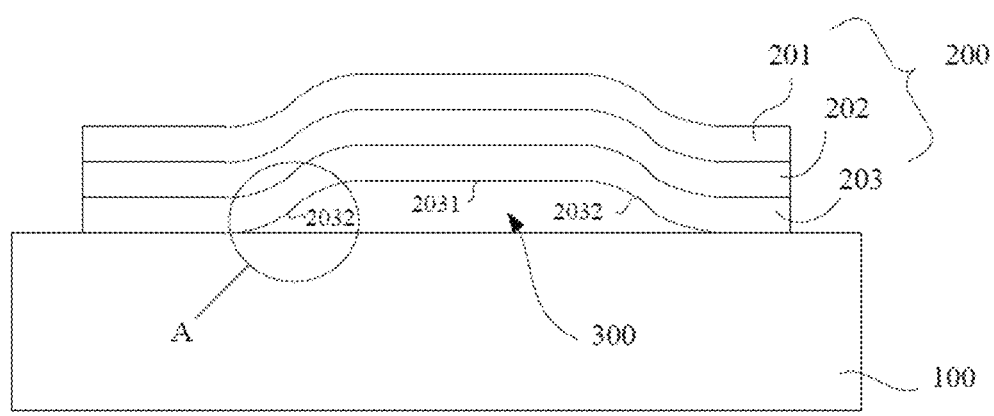
FIG. 1 is a structure diagram of a resonator according to an embodiment of the application.

Referring to FIG. 1, a resonator according to the application may include a substrate 100 and a multilayer structure 200. The multilayer structure 200 is formed on the substrate 100, and the multilayer structure 200 successively includes a lower electrode layer 203, a piezoelectric layer 202 and an upper electrode layer 201 from bottom to top. A cavity 300 is formed between the substrate 100 and the multilayer structure 200, and the cavity 300 is delimited by an upper surface of the substrate 100 and a lower surface of the multilayer structure 200. A middle region 2031 of a part, corresponding to the cavity 300, of the lower surface of the multilayer structure 200 is a plane, a smooth curved surface 2032 for smooth transition is between an edge of the middle region 2031 and an edge of the cavity 300, and the smooth curved surface 2032 is between the upper surface of the substrate 100 and the plane (a plane corresponding to the middle region 2031). The smooth curved surface 2032 can ensure the performances of the resonator cavity, and no sudden changes would occur. The smooth curved surface 2032 is a part of the lower surface of the multilayer structure 200.

According to the resonator, the cavity 300 is formed between the substrate 100 and the multilayer structure 200. The cavity 300 is delimited by the upper surface of the substrate 100 and the lower surface of the multilayer structure 200. The middle region 2031 of the part, corresponding to the cavity 300, of the lower surface of the multilayer structure 200 is a plane. The smooth curved surface 2032 for smooth transition is between the edge of the middle region 2031 and the edge of the cavity 300, and the smooth curved surface 2032 is between the upper surface of the substrate 100 and the plane. In this way, a novel resonator structure with higher performances can be formed.

Figure 2:
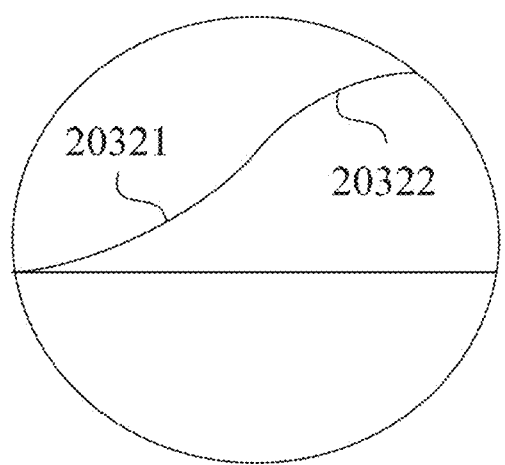
FIG. 2 is an enlarged schematic diagram of a region A in FIG. 1.

Referring to FIG. 2, in some embodiments, the smooth curved surface 2032 may include a first curved surface 20321 and second curved surface 20322 that are connected in a manner of smooth transition. The first curved surface 20321 and second curved surface 20322 that are connected in a manner of smooth transition means there is no sudden changes at a junction between the first curved surface 20321 and the second curved surface 20322 and both the first curved surface 20321 and the second curved surface 20322 are also curved surfaces without any sudden changes, so that the performances of the resonator cavity may be ensured. The multilayer structure 200 is formed by a plurality of crystals, and no sudden changes mean that gaps between crystals at the first smooth curved surface should not be too large and influence the performances of the resonator.

For example, a vertical section of the first curved surface 20321 may have a shape of inverted parabola, a vertical section of the second curved surface 20322 may have a shape of parabola, and the first curved surface 20321 is below the second curved surface 20322. The first curved surface 20321 is connected with the second curved surface 20322 in a manner of smooth connection. Certainly, the first curved surface 20321 and the second curved surface 20322 may also be curved surfaces in other shapes, as long as the gaps between crystals at the smooth curved surface 2032 do not influence the performances of the resonator.

Further, the upper surface of the substrate 100 has no sudden changes. Optionally, the upper surface of the substrate 100 is a plane.

In some embodiments, when it is mentioned that the smooth curved surface 2032 is smooth as a whole, it may mean that a curvature of the smooth curved surface 2032 at each point is less than a first preset value. The first preset value may be determined according to a practical condition such that the gaps between crystals at the smooth curved surface 2032 do not influence the performances of the resonator. For ensuring mechanical and electrical characteristics of the multilayer structure, a curvature of the smooth curved surface at the transition region would be as low as possible. Given a certain thickness of a sacrificial layer, the curvature as low as possible may cause a length of the transition region to increase, resulting in an increase of an area of a single resonator. Therefore, the curvature and length of the transition region need to be optimized.

Preferably, a height of the cavity 300 is any value between 100 nm and 2,000 nm.

In some embodiments, an included angle between the substrate 100 and a tangent plane at a junction of the smooth curved surface 2032 and the substrate 100 is less than 45 degrees. When the included angle between the tangent plane and the substrate 100 is less than 45 degrees, the resonator may have higher performances.

In the above embodiments, the substrate 100 may be a Si substrate, and may also be any one of a gallium arsenide substrate, a silicon carbide substrate, a sapphire substrate, a lithium niobate substrate, a lithium tantalate substrate or various composite substrates. There are no limits made thereto.

Compared with a Film Bulk Acoustic Resonator (FBAR), a coupled resonator filter (SBAR), a Stacked Bulk Acoustic Resonator (SBAR), a Dual Bulk Acoustic Resonator (DBAR) and a Solidly Mounted Resonator (SMR) which are conventional, the resonator manufactured by the method described in the above may be called a Bridge Bulk Acoustic Resonator (BBAR).

Figure 3:
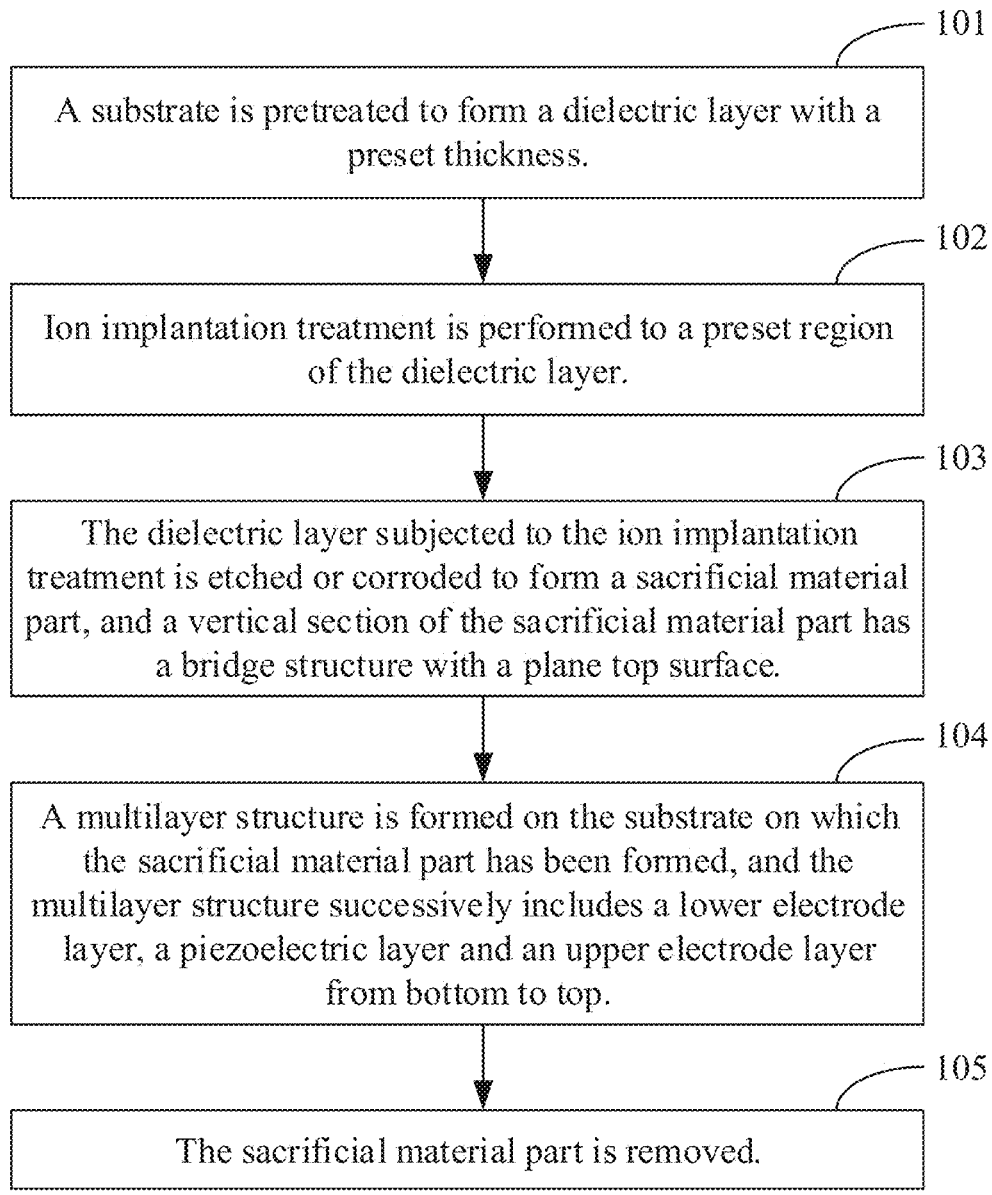
FIG. 3 is a flowchart of a process for manufacturing the resonator according to an embodiment of the application.

Referring to FIG. 3, a process for manufacturing the resonator will be described below in detail.

At step 101, a substrate is pretreated to form a dielectric layer with a preset thickness.

Figure 4A:
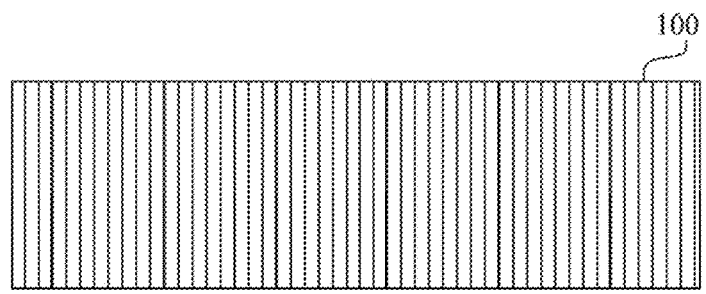
FIGS. 4A-4F are schematic diagrams of a process for manufacturing the resonator according to an embodiment of the application.
Figure 4B:
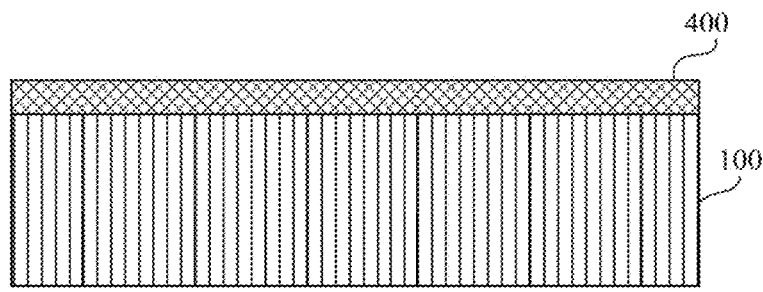

In the step, pretreatment may be oxidization treatment. That is, oxidization treatment is performed to the substrate 100 to form the dielectric layer 400 with the preset thickness, as shown in FIG. 4B. In some embodiments, the oxidization treatment may be performed to the substrate by placing the substrate in an oxidization atmosphere, such that an oxide layer with the preset thickness is formed on the substrate. Illustratively, high-purity oxygen may be introduced toward the substrate in an environment at a process temperature of a preset temperature range to form the oxide layer on the substrate by wet-oxygen oxidization or hydrogen-oxygen synthesis oxidation. The preset temperature range may be 1,000° C. to 1,200° C.

In addition, step 101 may also be implemented through the following operation: the substrate 100 is pretreated by vapor deposition to form the dielectric layer 400 with the preset thickness, as shown in FIG. 4B. The vapor deposition may be Plasma Enhanced Chemical Vapor Deposition (PECVD) or Low Pressure Chemical Vapor Deposition (LPCVD).

Further, step 101 may also be implemented through the following operation: the substrate is pretreated by sputtering to form the dielectric layer with the preset thickness.

Moreover, step 101 may also be implemented through the following operation: the substrate is pretreated by electron beam evaporation to form the dielectric layer with the preset thickness.

At step 102, ion implantation treatment is performed to a preset region of the dielectric layer.

In the step, by performing ion implantation treatment to the preset region of the dielectric layer, an etching or corroding rate of the preset region of the dielectric layer is allowed to be greater than an etching or corroding rate of the region outside the preset region of the dielectric layer, such that a dielectric layer with a preset shape can be formed when etching or corroding the dielectric layer.

Figure 4C:
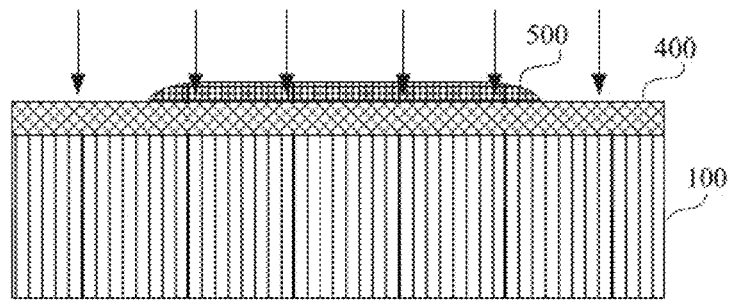

In some embodiments, step 102 may be implemented through the following operations: a shielding layer 500 is formed on the preset region of the dielectric layer 400, and ion implantation treatment is performed to the whole dielectric layer 400 after the shielding layer 500 is formed thereon, as shown in FIG. 4C.

By forming the shielding layer 500 on the preset region of the dielectric layer 400 and then performing ion implantation to the whole dielectric layer 400, the shielding layer 500 may shield or reduce, to a certain extent, influence of ion implantation on the dielectric layer 400 covered by the shielding layer 500, such that a sacrificial material part with a preset shape can be formed in a subsequent step.

In the step, forming the shielding layer on the preset region of the dielectric layer may include that: the shielding layer 500, of which a thickness of an edge is less than a thickness of a middle region, is formed on the preset region of the dielectric layer 400, and a middle region of the shielding layer 500 is plane, as shown in FIG. 4C. When ion implantation is performed to the dielectric layer 400 shown in FIG. 4C, due to the presence of the shielding layer 500, the part of the dielectric layer under the shielding layer 500 is influenced less by ion implantation. When energy for ion implantation is lower, ion implantation would not penetrate through the shielding layer 500 and reach the dielectric layer under the shielding layer 500; while a doped impurity would be implanted to the part of the dielectric layer uncovered by the shielding layer 500 in a preset depth. The shape of the shielding layer 500 would influence the shape of the sacrificial material part formed at step 103. In general, the shape of the sacrificial material part is consistent with the shape of the shielding layer 500. Therefore, a finally desired shape of a cavity may be obtained by designing the specific shape of the shielding layer.

As an implementable mode, performing ion implantation treatment to the whole dielectric layer 400 after the shielding layer 500 is formed thereon at step 102 includes that: a doped impurity is implanted to the whole dielectric layer including a region of the shielding layer with a preset dose and preset energy. The preset dose influences the etching or corroding rate at step 103, and the preset energy influences the ion implantation depth and thereby influences a height of the cavity.

Specifically, if a preset dose for ion implantation at a certain region is greater, the etching or corroding rate for this region at step 103 is higher. If the preset dose for ion implantation at a certain region is smaller, the etching or corroding rate for this region at step 103 is lower. If a certain region has not been implanted with the doped impurity due to the presence of the shielding layer 500, the etching or corroding rate for this region at step 103 is minimum.

For the preset energy, if the preset energy for ion implantation at a certain region is higher, the ion implantation depth of this region is greater, and after the cavity is finally formed, a height of the cavity corresponding to this part is greater. If the preset energy for ion implantation at a certain region is lower, the ion implantation depth of this region is smaller, and after the cavity is finally formed, the height of the cavity corresponding to this part is smaller.

In the above implementable mode, the shape of the shielding layer 400 is preset, and ion implantation with the preset dose and the preset energy may be performed only once, and then the sacrificial material part with a desired shape can be formed by etching or corroding at step 103. For example, the sacrificial material part may have a plane top surface and a vertical section of a bridge structure.

Optionally, in order to obtain a resonator cavity with higher performances, a thickness of the shielding layer gradually decreases from an edge of the middle region thereof to an edge of the shielding layer, so that there is no sudden change in a curved surface between the edge of the middle region of the shielding layer and the edge of the shielding layer, and the performances of the resonator cavity may be ensured thereby. The substrate 100 and a multilayer structure 200 of the final resonator are formed by a plurality of crystals, and no sudden change means that relatively smooth transition is formed at points of the curved surface present between the edge of the middle region of the shielding layer and the edge of the shielding layer, such that gaps between crystals of the part, corresponding to the cavity, of the multilayer structure 200 of the resonator should not be too large and influence the performances of the resonator.

For example, a smooth curved surface for smooth transition is present between the edge of the middle region of the shielding layer and the edge of the shielding layer, and the resonator cavity finally formed in this way is shown as 300 in FIG. 1. The gaps between crystals of the part corresponding to the resonator cavity should not be too large and influence the performances of the resonator, and no sudden changes would occur. In some embodiments, an included angle between the substrate 100 and a tangent plane at a junction of the smooth curved surface and the substrate 100 is less than 45 degrees, and the resonator cavity formed in this way has higher performances.

Illustratively, the smooth curved surface may include a first and second curved surfaces that are connected in a manner of smooth transition.

A vertical section of the first curved surface has a shape of inverted parabola, a vertical section of the second curved surface has a shape of parabola, and the first curved surface is below the second curved surface. In such a manner, the finally formed resonator cavity is shown as 300 in FIG. 1, corresponding to the first curved surface and second curved surface in the smooth curved surface.

As another implementable mode, performing ion implantation treatment to the whole dielectric layer after the shielding layer 500 is formed thereon at step 102 includes that: the doped impurity is implanted to the whole dielectric layer including the region of the shielding layer with preset doses and preset energy for many times, in which the preset doses or preset energy for ion implantations are all different or are not completely the same.

The shielding layer may have a uniform thickness, or the thickness of the edge is less than the thickness of the middle region, and the middle region is plane. There are no limits made thereto. Herein, by adjusting the preset dose or preset energy for each ion implantation, a desired shape of the sacrificial material part can be obtained at step 103.

Figure 5:
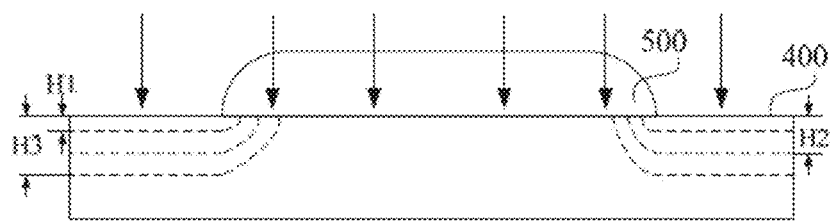
FIG. 5 is a schematic diagram of three ion implantations according to an embodiment of the application.

In the embodiment, for given preset energy, the preset doses for the ion implantations may be sequenced from low to high and then from high to low. In such a way, after ion implantation for many times, a plurality of doped impurity layers may be formed at the edge of the shielding layer. The doped impurity layer is thicker in response to the ion implantation with higher energy, and the doped impurity layer is thinner in response to the ion implantation with lower energy, as shown in FIG. 5. In order to clearly illustrate ion implantations, FIG. 5 only shows the shielding layer 500 and the dielectric layer 400.

FIG. 5 illustrates three ion implantations with different doses and different energy, but the embodiment is not limited thereto. For example, the dose and energy for the first ion implantation are referred to as a first dose and a first energy respectively; the dose and energy for the second ion implantation are referred to as a second dose and a second energy respectively; the dose and energy for the third ion implantation are referred to as a third dose and a third energy respectively; the first energy is higher than the second energy, and the second energy is higher than the third energy; the first dose is greater than the second dose, and the second dose is greater than the third dose. In this case, a depth of the first ion implantation is H1, a depth of the second ion implantation is H2 and a depth of the third ion implantation is H3, with H1>H2>H3. Each doped impurity layer is illustrated by the dotted line in FIG. 5. In the embodiment, the depth of the first ion implantation with the highest energy is less than the thickness of the shielding layer 500, and thus no ions are implanted to a part under the middle region of the shielding layer 500.

Optionally, a direction for each ion implantation is vertical to the substrate 100.

Alternatively, a direction for each ion implantation forms a preset angle with the substrate 100 that is not 90 degrees (the preset angles for ion implantations are all different or are not completely the same).

Alternatively, the directions for some ion implantations are vertical to the substrate 100, and the directions of the remaining ion implantations form acute angles less than a preset angle with the substrate 100.

Figure 6A:
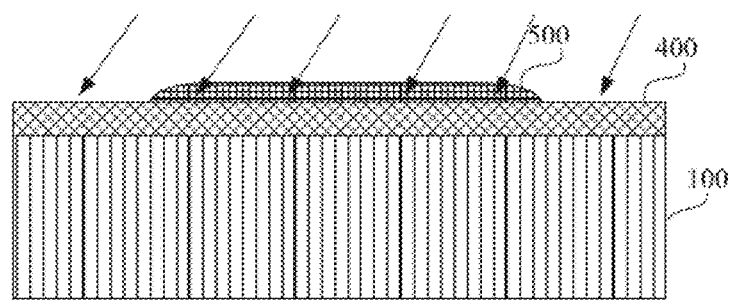
FIGS. 6A-6B are schematic diagrams of an ion implantation in an inclined direction under a shielding layer structure according to an embodiment of the application.
Figure 6B:
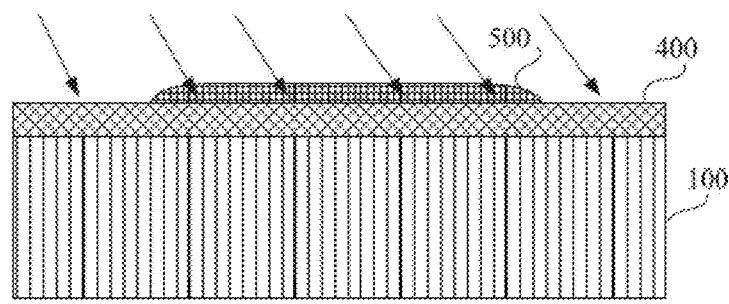

It can be understood that, at the edge of the shielding layer, the thickness of the shielding layer in the direction of the ion implantation can be adjusted by changing the direction of the ion implantation (as shown in FIGS. 6A-6B), thereby obtaining doped impurity layers with different depths and resulting in a smoother curved surface at an edge of the sacrificial material part. In the embodiment, the curved surface at the edge of the sacrificial material part would become smoother by ion implantations with the preset doses and preset energy in conjunction with changing the direction for each ion implantation.

The above is the circumstance that the thickness of the edge is less than the thickness of the middle region of the shielding layer. The circumstance that the thickness of the shielding layer is uniform will be elaborated below.

Forming the shielding layer on the preset region of the dielectric layer and performing ion implantation treatment to the whole dielectric layer after the shielding layer is formed thereon at step 102 includes the following operations.

A: the shielding layer with a uniform thickness is formed on the preset region of the dielectric layer.

B: the doped impurity is implanted to the whole dielectric layer on which the shielding layer has been formed with a preset dose and a preset energy.

Removing the shielding layer, steps A and B are cyclically performed for many times, and the preset regions, preset doses or preset energy for ion implantations are different or not completely the same.

A plurality of doped impurity layers may be formed on the dielectric layer 400 by cyclically performing removing the shielding layer, steps A and B for many times, and then the dielectric layer 400 is etched or corroded at step 103 to form the sacrificial material part with a desired shape.

The preset regions, preset doses or preset energy for ion implantations are different or not completely the same. That is, three factors, i.e., the preset regions, the preset doses and the preset energy corresponding to ion implantations, are all different, or one of the three factors for ion implantations may be the same.

Figure 7:
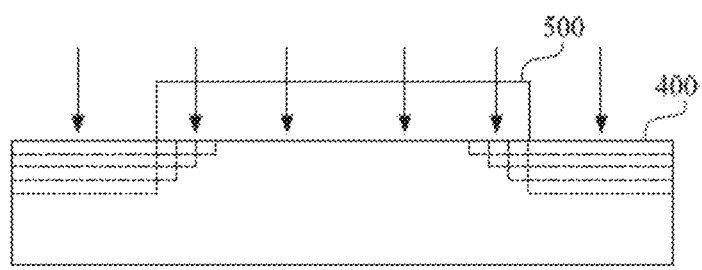
FIG. 7 is a schematic diagram of four ion implantations according to an embodiment of the application.

Referring to FIG. 7, four ion implantations are illustrated, but the embodiment is not limited thereto. In order to clearly illustrate ion implantations, FIG. 7 only shows the shielding layer 500 and the dielectric layer 400. A first shielding layer with a uniform thickness is formed on a first preset region of the dielectric layer, and a first ion implantation is performed. Energy for the first ion implantation is minimum and a depth of the first ion implantation is minimum. After the first shielding layer is removed, a second shielding layer with a uniform thickness is formed on a second preset region of the dielectric layer, and a second ion implantation is performed. Energy for the second ion implantation is higher than the energy for the first ion implantation and a depth of the second ion implantation is greater than the depth of the first ion implantation. After the second shielding layer is removed, a third shielding layer with a uniform thickness is formed on a third preset region of the dielectric layer, and a third ion implantation is performed. Energy for the third ion implantation is higher than the energy for the second ion implantation and a depth of the third ion implantation is greater than the depth of the second ion implantation. After the third shielding layer is removed, a fourth shielding layer with a uniform thickness is formed on a fourth preset region of the dielectric layer, and a fourth ion implantation is performed. Energy for the fourth ion implantation is higher than the energy for the third ion implantation and a depth of the fourth ion implantation is greater than the depth of the third ion implantation. For the four ion implantations, the energy is inversely proportional to a size of the preset region, and a larger preset region covers a smaller preset region.

Optionally, at step 102, the direction for each ion implantation is vertical to the substrate.

Alternatively, the direction for each ion implantation forms the preset angle with the substrate that is not 90 degrees (the preset angles for ion implantations are all different or are not completely the same).

Alternatively, the directions for some ion implantations are vertical to the substrate and the directions of the remaining ion implantations form acute angles less than the preset angle with the substrate.

Figure 8A:
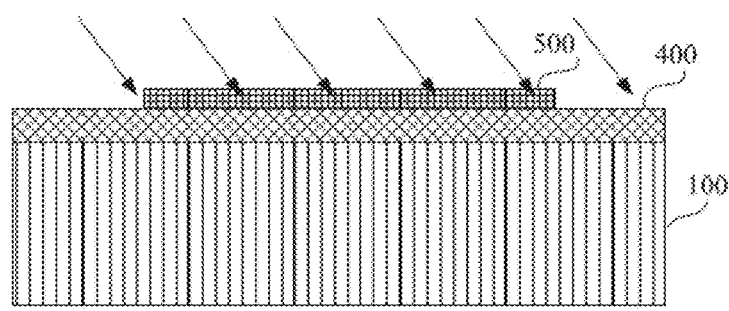
FIGS. 8A-8B are schematic diagrams of an ion implantation in an inclined direction under another shielding layer structure according to an embodiment of the application.
Figure 8B:
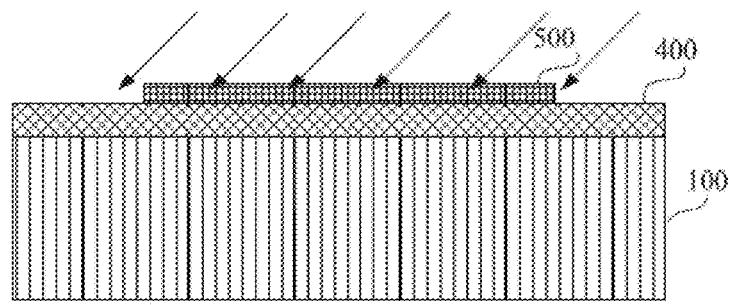

It can be understood that, when the shielding layer 400 has a uniform thickness, a direction of ion implantation and the substrate 100 may form a preset angle which is not 90 degrees at the edge of the shielding layer 400, by changing the direction of ion implantation (as shown in FIGS. 8A-8B). In such a way, the thickness of the shielding layer 400 in the direction of ion implantation is not uniform everywhere, so that an ion implantation effect at the edge of the shielding layer 400 is substantially the same as the case in which the thickness of the edge is less than the thickness of the middle region.

At step 103, the dielectric layer subjected to ion implantation treatment is etched or corroded to form a sacrificial material part, and the sacrificial material part has a plane top surface and a vertical section of a bridge structure.

Figure 4D:
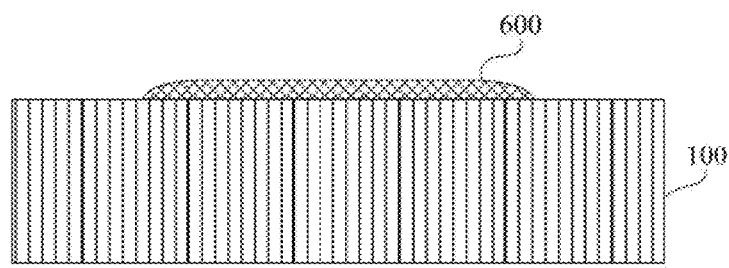

By performing ion implantation treatment to the dielectric layer at step 102, the dielectric layer covered by the shielding layer is not implanted with ions or the implantation depth thereof is shallower, and the ion implantation depth of the dielectric layer uncovered by the shielding layer is deeper. Therefore, when the dielectric layer is etched, the shielding layer and the dielectric layer uncovered by the shielding layer are etched or corroded at a higher rate, and the dielectric layer which is not implanted with ions is etched or corroded at a lower rate, such that the sacrificial material part with a desired shape can be formed. In the embodiment, the sacrificial material part 600 has a plane top surface and a vertical section of a bridge structure (referring to FIG. 4D). The top surface is defined as a surface, facing away from the substrate 100, of the sacrificial material part 600.

In some embodiments, the shielding layer may be made from SiN, may also have a multilayer film structure and may also be a photoresist. There are no limits made thereto. The shielding layer is used to shield ion implantation or block part of implanted ions, resulting in a significant difference of the etching or corroding rates between a shielded region and a non-shielded region. The etching or corroding rate of the shielded region is higher and the etching or corroding rate of the non-shielded region is lower, such that the desired sacrificial material part can be formed at the step. Since the thickness gradually decreases from the edge of the middle region of the shielding layer to the edge of the shielding layer, a transition region where no changes occur in rate may be formed at the edge of the shielding layer. At the transition region, a smooth curved surface may be formed by optimizing an oxidization manner and a type and structure of the shielding layer, such that a crystal quality of the piezoelectric film may be ensured when growing a multilayer structure comprising a piezoelectric film, such as AlN, on this smooth curved surface.

At step 104, a multilayer structure is formed on the substrate on which the sacrificial material part has been formed. The multilayer structure successively includes a lower electrode layer, a piezoelectric layer and an upper electrode layer from bottom to top.

Figure 4E:
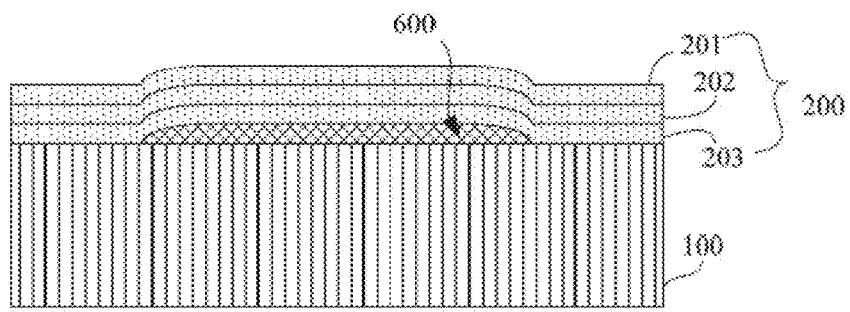

Referring to FIG. 4E, the multilayer structure 200 is formed on the substrate 100 on which the sacrificial material part 600 has been formed. The multilayer structure 200 successively includes the lower electrode layer 203, the piezoelectric layer 202 and the upper electrode layer 201 from bottom to top.

At step 105, the sacrificial material part is removed.

Figure 4F:
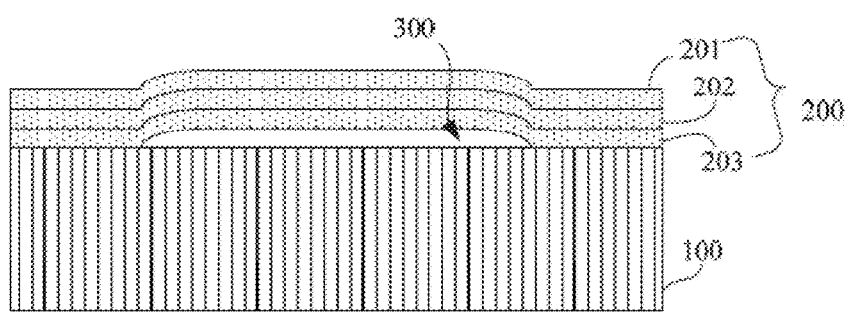

Referring to FIG. 4F, at the step, the sacrificial material part is removed to form a cavity 300. A shape of the cavity 300 is consistent with the shape of the sacrificial material part.

The above are only the preferred embodiments of the application and not intended to limit the application. Any modifications, equivalent replacements, improvements and the like made within the spirit and principle of the application shall fall within the scope of protection of the application.

The invention claimed is:

1. A resonator, comprising:
   a substrate; and
   a multilayer structure, formed on the substrate, the multilayer structure successively comprising a lower electrode layer, a piezoelectric layer and an upper electrode layer from bottom to top,
   wherein a cavity is formed between the substrate and the multilayer structure, the cavity is delimited by an upper surface of the substrate and a lower surface of the multilayer structure, a middle region of a part, corresponding to the cavity, of the lower surface of the multilayer structure is a plane, a smooth curved surface for smooth transition is between an edge of the middle region and an edge of the cavity, and the smooth curved surface is between the upper surface of the substrate and the plane,
   wherein the smooth curved surface comprises a first curved surface and a second curved surface that are connected in a manner of smooth transition,
   wherein a vertical section of the first curved surface has a shape of an inverted parabola, a vertical section of the second curved surface has a shape of a parabola, and the first curved surface is below the second curved surface, and
   wherein the upper surface of the substrate is planar.

2. The resonator of claim 1, wherein a curvature of the smooth curved surface at each point is less than a first preset value.

3. The resonator of claim 1, wherein an included angle between the substrate and a tangent plane at a junction of the smooth curved surface and the substrate is less than 45 degrees.

4. The resonator of claim 1, wherein a height of the cavity is any value between 100 nm and 2,000 nm.

5. The resonator of claim 1, wherein the substrate is any one of a gallium arsenide substrate, a silicon carbide substrate, a sapphire substrate, a lithium niobate substrate, a lithium tantalate substrate or various composite substrates.

6. The resonator of claim 1, wherein the substrate is a Si substrate.

7. A semiconductor device, comprising a resonator, the resonator comprises:
   a substrate; and
   a multilayer structure, formed on the substrate, the multilayer structure successively comprising a lower electrode layer, a piezoelectric layer and an upper electrode layer from bottom to top,
   wherein a cavity is formed between the substrate and the multilayer structure, the cavity is delimited by an upper surface of the substrate and a lower surface of the multilayer structure, a middle region of a part, corresponding to the cavity, of the lower surface of the multilayer structure is a plane, a smooth curved surface for smooth transition is between an edge of the middle region and an edge of the cavity, and the smooth curved surface is between the upper surface of the substrate and the plane, wherein the smooth curved surface comprises a first curved surface and a second curved surface that are connected in a manner of smooth transition, wherein a vertical section of the first curved surface has a shape of an inverted parabola, a vertical section of the second curved surface has a shape of a parabola, and the first curved surface is below the second curved surface, and wherein the upper surface of the substrate is planar.

8. The semiconductor device of claim 7, wherein a curvature of the smooth curved surface at each point is less than a first preset value.

9. The semiconductor device of claim 7, wherein an included angle between the substrate and a tangent plane at a junction of the smooth curved surface and the substrate is less than 45 degrees.

10. The semiconductor device of claim 7, wherein a height of the cavity is any value between 100 nm and 2,000 nm.

11. The semiconductor device of claim 7, wherein the substrate is any one of a gallium arsenide substrate, a silicon carbide substrate, a sapphire substrate, a lithium niobate substrate, a lithium tantalate substrate or various composite substrates.

12. The semiconductor device of claim 7, wherein the substrate is a Si substrate.

\* \* \* \* \*

UNITED STATES PATENT AND TRADEMARK OFFICE
CERTIFICATE OF CORRECTION

PATENT NO. : 11,664,783 B2  
APPLICATION NO. : 16/970006  
DATED : May 30, 2023  
INVENTOR(S) : Liang Li et al.

Page 1 of 1

It is certified that error appears in the above-identified patent and that said Letters Patent is hereby corrected as shown below:

On the Title Page

In item (73) titled Assignee, Please delete:
"The 13th Research Institute of China Electronics"

And replace with:
The 13th Research Institute of China Electronics Technology Group Corporation Signed and Sealed this  
Eighteenth Day of July, 2023

Katherine Kelly Vidal  
*Director of the United States Patent and Trademark Office*